(12) United States Patent
Sakurai et al.

(10) Patent No.: US 6,614,645 B1
(45) Date of Patent: Sep. 2, 2003

(54) MATCHED CAPACITOR ARRAY

(75) Inventors: Satoshi Sakurai, San Diego, CA (US); Jason Chin, Alameda, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/293,628

(22) Filed: Nov. 12, 2002

(51) Int. Cl.[7] ............................................. H01G 4/38
(52) U.S. Cl. ........................................ 361/328; 361/349
(58) Field of Search ................................. 361/328, 329, 361/306.1, 330

(56) References Cited

U.S. PATENT DOCUMENTS

| | | | | |
|---|---|---|---|---|
| 5,428,499 A | * | 6/1995 | Szerlip et al. | 361/328 |
| 6,198,619 B1 | * | 3/2001 | Fujioka | 361/328 |
| 6,373,220 B1 | * | 4/2002 | Wipperfurth et al. | 320/107 |

* cited by examiner

*Primary Examiner*—Anthony Dinkins
(74) *Attorney, Agent, or Firm*—Wagner, Murabito & Hao LLP (57) ABSTRACT

A capacitor array of the present invention has a plurality of core capacitors arranged in a plurality of rows and a plurality of columns. A plurality of guard capacitors are arranged such that there is a guard capacitor at the beginning and end of each of the rows and columns of core capacitors. A plurality of fringe capacitors are arranged between the guard capacitors and the core capacitors. The top plates of the core capacitors and the top plates of the fringe capacitors are coupled to a first node of a circuit. The top and bottom plates of the guard capacitors and the bottom plates of the fringe capacitors are coupled to ground. The each of the bottom plates of the core capacitors are independently coupled to a respective independent node of the circuit. The various capacitors of the array and the means for coupling them are uniformly distributed such that each core capacitor is uniformly influenced by its adjacent structure. Thus, each core capacitor in the capacitor array has substantially matched primary and parasitic capacitances.

15 Claims, 6 Drawing Sheets

MATCHED CAPACITOR ARRAY

FIELD OF THE INVENTION

Embodiments of the present invention relate to matched capacitor arrays, and more particularly to reducing capacitance variations within a matched capacitor array.

BACKGROUND OF THE INVENTION

Various integrated circuits, such as analog-to-digital converters, digital-to-analog converters, switch capacitor filters, and the like, utilize matched capacitor arrays. As integrated circuit technology progresses, the matching of such capacitor arrays requires ever increasing precision. The precision to which the capacitors can be matched is influenced by the physical uniformity of the capacitor structures and the electrical coupling between adjacent capacitors.

For parallel plate capacitor structures, which are typically utilized in matched capacitor arrays, the capacitance is proportional to the area of the overlapping plates and inversely proportional to the separation thereof. Furthermore, as minimum feature sizes decrease, it becomes increasingly more difficult to maintain the uniformity of structures. Hence, it also becomes more difficult to reduce capacitance variations. For example, alignment errors increase as the number of masks required for forming the structure increases. Furthermore, the planarity of the wafer surface degrades as layers are formed thereupon. The non-planar surface introduces non-uniformity in the thickness of the layers formed thereupon. The non-planar surface also introduces non-uniformity in the line edges of the patterned photo mask, and hence the line edges of the etched structures.

Figure 1A:
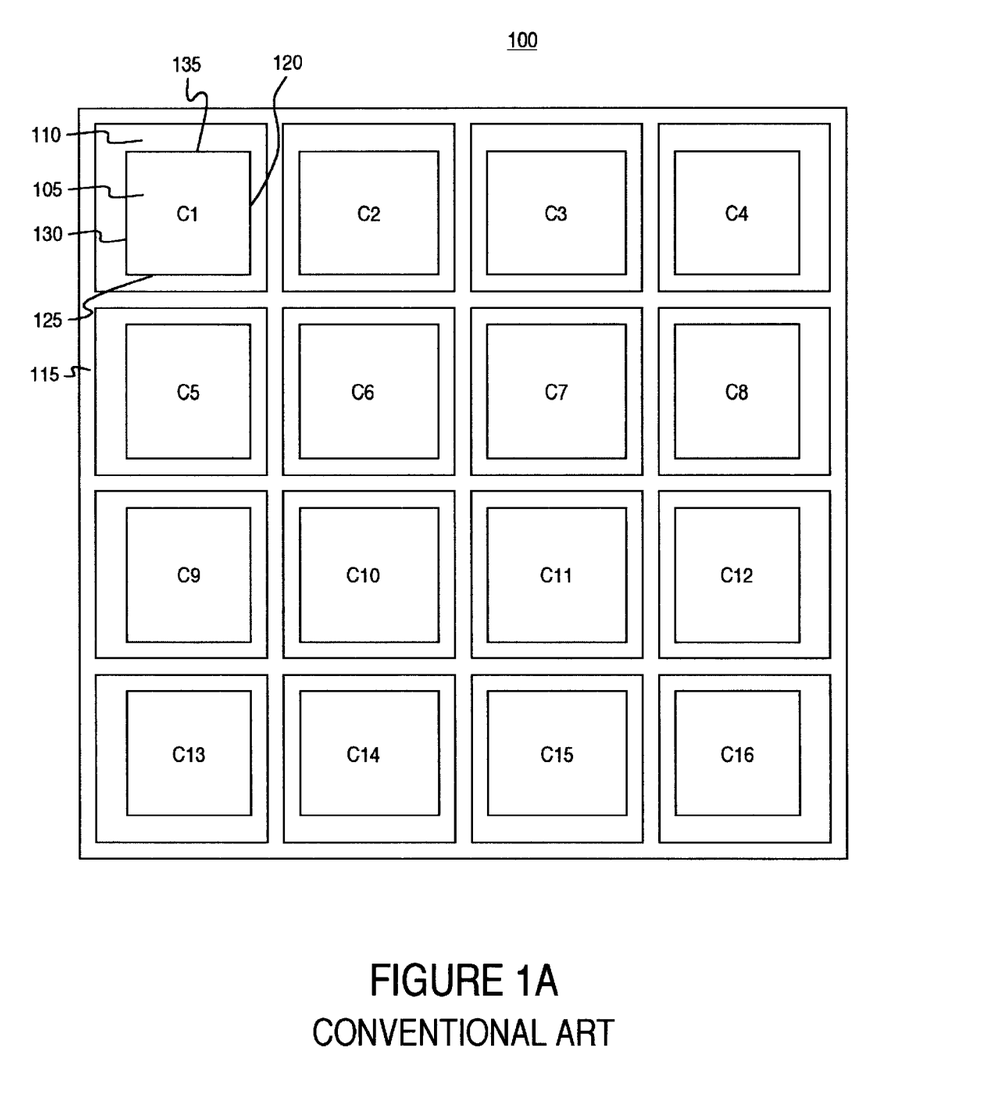
FIGS. 1A–1B show top and side section views of a capacitor array, in accordance with the conventional art.
Figure 1B:
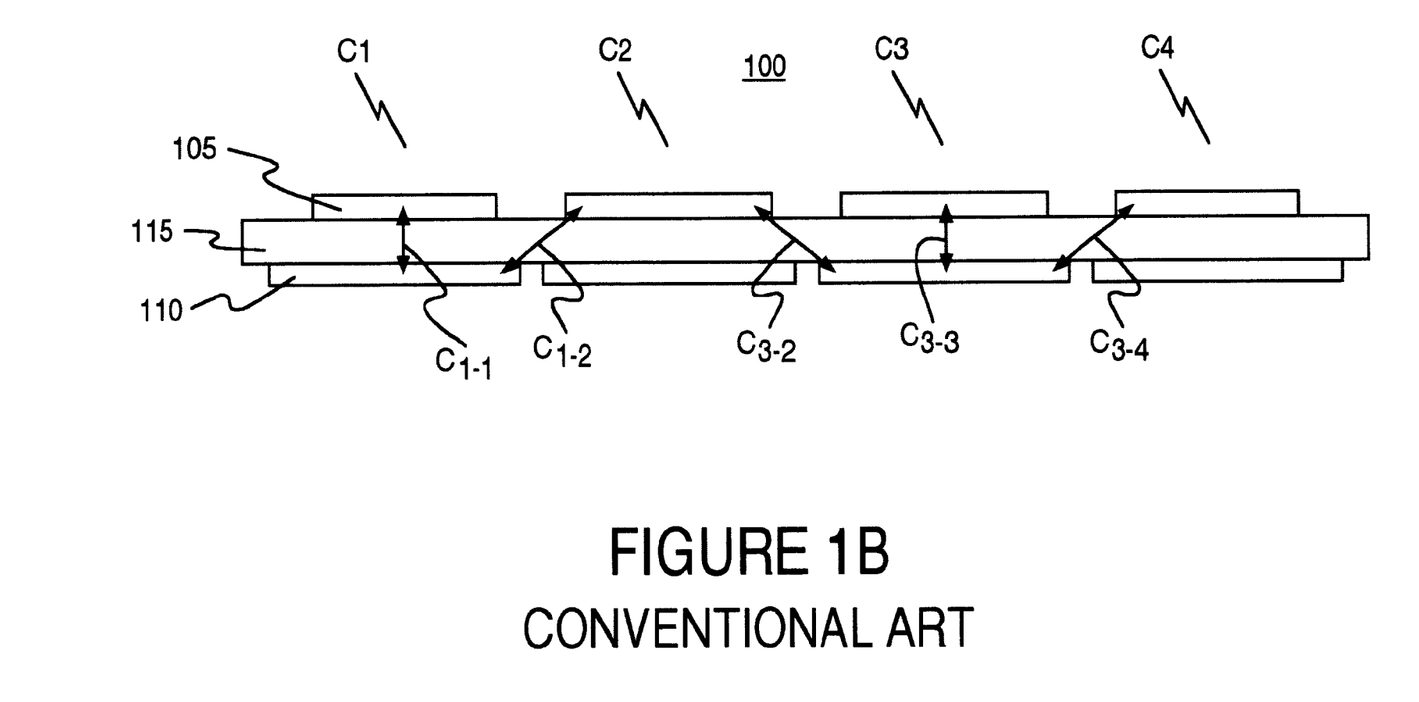

Referring to FIGS. 1A–1B, top and side section views of a capacitor array 100, in accordance with the conventional art, is shown. The capacitor array 100 comprises a plurality of top plates 105 and a plurality of bottom plates 110. The top 105 and bottom 110 plates are separated by a dielectric material 115. Each individual top plate 105 is aligned with a respective bottom plate 110 to form a capacitor (e.g., C1–C16). Typically, the top plates 105 are electrically connected in common. Individual electrical connections are provided to each bottom plate 110.

The interior edges of the individual capacitors 120, 125 along the periphery of the array 100 each have an adjacent capacitor; while the exterior edges of the individual capacitors 130, 135 do not have an adjacent capacitor. The deposition, lithography and etching processes utilized in forming the various structures are influenced by non-uniformity of the surface that they act upon. Thus, the presence or absence of adjacent structure may result in a wider or narrower dielectric layer along an edge, which results in variations in the separation between the plates. The presence or absence of adjacent structure may also result in a wider or narrower line edge in the top and/or bottom plates, which results in variations in the area of the plates. The primary capacitance of each capacitor is influenced by such variations in the adjacent structure.

The physical structure of the various capacitors in the array 100 are influenced differently. For example, the capacitors at the corners (e.g., C1) only have adjacent structures on two sides. The capacitors along the periphery (e.g., C5), but not the corners, have adjacent structures on three sides. While the capacitors in the interior (e.g., C6) of the array have adjacent structures on all four sides. Therefore, various capacitors will have different primary capacitance values.

In addition, as the separation between adjacent capacitors is reduced, parasitic capacitance, caused by the cross-coupling of oppositely disposed plates of adjacent capacitors, increases. The presence or absence of adjacent capacitors influences the parasitic capacitances of the various capacitors. For example, the capacitors at the corners (e.g., C1, C4, C13, C16) of the array 100 have two adjacent capacitors. Therefore, the corner capacitors (e.g., C1, C4, C13, C16) have two parasitic capacitances contributing to their total capacitance. The capacitors along the periphery of the array 100 (e.g., C2, C3, C5, C8, C9, C12, C14, C15) have adjacent structures on three sides. Therefore, the capacitors along the periphery (e.g., C2, C3, C5, C8, C9, C12, C14, C15) have three parasitic capacitances contributing to their total capacitance. The capacitors in the interior of the array 100 (e.g., C6, C7, C10, C11) have adjacent structures on all four sides. Therefore, the interior capacitors (e.g., C6, C7, C10, C11) have four parasitic capacitances contributing to their total capacitance. Thus, various capacitors will have different parasitic capacitance values.

For the exemplary capacitor array 100 shown in FIG. 1, the total capacitance for each capacitor is represented by the equations in Table 1. For example, the total capacitance of capacitor C1 is equal to the sum of the primary capacitance $C_{1-1}$ of capacitor C1, the cross-coupled capacitance $C_{1-2}$ between capacitors C1 and C2, and the cross-coupled capacitance $C_{1-5}$ between capacitors C1 and C5.

TABLE 1

| | |
|---|---|
| $C1 = C_{1-1} + C_{1-2} + C_{1-5}$ | $C9 = C_{9-9} + C_{9-5} + C_{9-10} + C_{9-13}$ |
| $C2 = C_{2-2} + C_{2-1} + C_{2-3} + C_{2-6}$ | $C10 = C_{10-10} + C_{10-6} + C_{10-9} + C_{10-11} + C_{10-14}$ |
| $C3 = C_{3-3} + C_{3-2} + C_{3-4} + C_{3-7}$ | $C11 = C_{11-11} + C_{11-7} + C_{11-10} + C_{11-12} + C_{11-15}$ |
| $C4 = C_{4-4} + C_{4-3} + C_{4-8}$ | $C12 = C_{12-12} + C_{12-8} + C_{12-11} + C_{12-16}$ |
| $C5 = C_{5-5} + C_{5-1} + C_{5-6} + C_{5-9}$ | $C13 = C_{13-13} + C_{13-9} + C_{13-14}$ |
| $C6 = C_{6-6} + C_{6-2} + C_{6-5} + C_{6-7} + C_{6-10}$ | $C14 = C_{14-14} + C_{14-10} + C_{14-13} + C_{14-15}$ |
| $C7 = C_{7-7} + C_{7-3} + C_{7-6} + C_{7-8} + C_{7-11}$ | $C15 = C_{15-15} + C_{15-11} + C_{15-14} + C_{15-16}$ |
| $C8 = C_{8-8} + C_{8-4} + C_{8-7} + C_{8-12}$ | $C16 = C_{16-16} + C_{16-12} + C_{16-15}$ |

The combined cross-coupling between a particular capacitor and multiple adjacent capacitors is referred to hereinafter as interdigitating capacitance.

Accordingly, conventional capacitor arrays suffer from variations in the physical (e.g., geometric) properties of the individual capacitors. Thus, precise capacitance matching in conventional capacitor arrays is problematic due to the physical variations. Conventional capacitor arrays also suffer from variations in the interdigitating capacitance of the individual capacitors. Thus, precise capacitance matching in conventional capacitor arrays is problematic due to parasitic capacitance variations.

SUMMARY OF THE INVENTION

A capacitor array, having substantially matched capacitances, is disclosed. In one embodiment, the capacitor array comprises a plurality of core capacitors arranged in a plurality of rows and a plurality of columns. A plurality of guard capacitors are arranged such that there is a guard capacitor at the beginning and end of each of the rows and columns of core capacitors. A plurality of fringe capacitors are arranged between the guard capacitors and the core capacitors. The top plates of the core capacitors and the top plates of the fringe capacitors are coupled to a first node of a circuit. The top and bottom plates of the guard capacitors and the bottom plates of the fringe capacitors are coupled to ground. Each of the bottom plates of the core capacitors are independently coupled to a respective independent node of the circuit. The various capacitors of the array and the means for coupling them are uniformly distributed such that each core capacitor is uniformly influenced by its adjacent structure. As a result, variations in the primary capacitance of each core capacitor are substantially reduced. The total capacitance of each core capacitor also has substantially equal parasitic capacitance components.

BRIEF DESCRIPTION OF THE DRAWINGS

The present invention is illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 2:
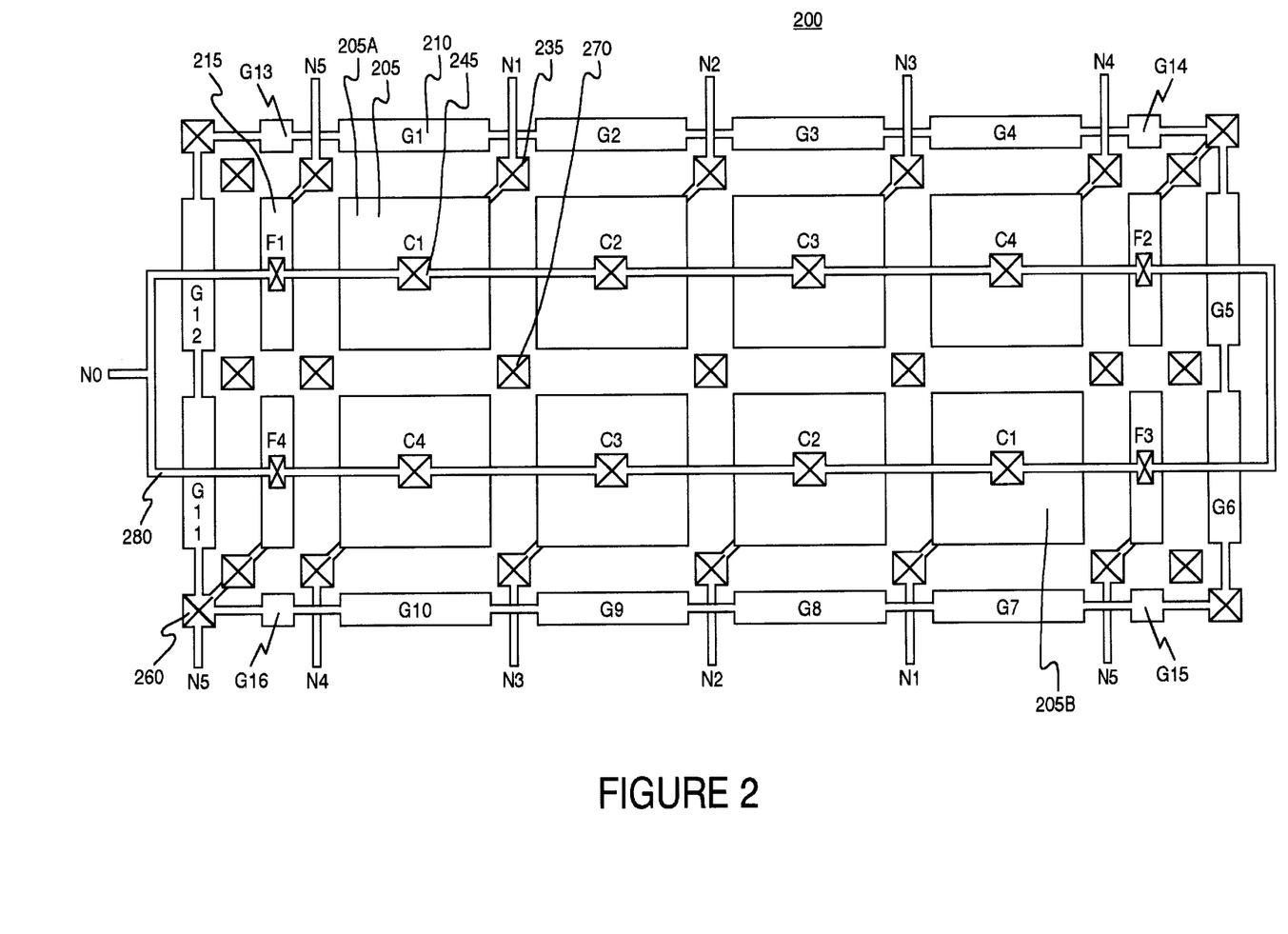
FIG. 2 shows a top view of a capacitor array, in accordance with one embodiment of the present invention.

Referring now to FIG. 2, a top view of a capacitor array 200, in accordance with one embodiment of the present invention, is shown. As depicted in FIG. 2, the capacitor array 200 comprises a plurality of core capacitors 205 arranged in rows and columns. The core capacitors 205, in one implementation (as shown), are arranged such that columns comprise two capacitors, and rows comprise three or more capacitors. In a second implementation, the core capacitors 205 are arranged such that columns comprise three or more capacitors, and rows comprise two capacitors. A plurality of guard capacitors 210 are arranged at the beginning and the end of each row and column of the core capacitors 205. Optionally, guard capacitors G13–G16 can be provided at the corners of the core capacitors 205. In the first implementation, a plurality of fringe capacitors 215 are arranged between the guard capacitors 210 and the beginning and end of each row of core capacitors 205. In the second implementation, a plurality of fringe capacitors 215 are arranged between the guard capacitors 210 and the beginning and end of each column of core capacitors 205.

Contacts 235 for the bottom plates of the core capacitors 205 are provided at substantially uniform positions. In an exemplary implementation, contacts 235 for the bottom core capacitor plates are provided along the periphery of core capacitors 205 substantially at the corner of each capacitor, such that the two adjacent capacitors are physically influence equally by the structure of the contacts 245.

Contacts 245 for the top plates of the core capacitors and the top plates of the fringe capacitors 215 are also provided at substantially uniform positions. In an exemplary implementation, contacts 245 for the top plates of the core capacitors 205 and the top plates of the fringe capacitors 215 are provided substantially at the center of each capacitor, such that each core capacitor 205 is physically influenced equally by the structure of the contacts 245.

Contacts 260 for the top and bottom plates of the guard capacitors 210 and the bottom plates of the fringe capacitors 215 are also provided at substantially uniform positions. In an exemplary implementation, contacts 260 for the top and bottom plates of the guard capacitors 210 and the bottom plates of the fringe capacitors 215 are provided substantially at the corners of the array 200, such that the core capacitors 205 are physically influence equally by the structure of the contacts 260.

Optionally, dummy contacts 270 are also provided between various capacitors (e.g., in the center and at the ends of the array) where contacts are not necessary. The dummy contacts 270 can be coupled to ground. The dummy contacts 270 ensure that all core capacitors 205 are physically influenced equally by the structure of the contacts 235 and dummy contacts 270.

Similarly, interconnecting traces 280 can be provided at substantially uniform positions, such that all core capacitors 205 are physically influenced equally. Additionally, dummy interconnecting traces can also be provided, such that all core capacitors 205 are physically influenced equally by the structure of the interconnecting traces and dummy interconnecting traces.

In an optional implementation of the present invention, each core capacitor 205 may be fabricated as a plurality of physically separate capacitors 205A, 205B (hereinafter referred to as component capacitors). The individual component capacitors 205A, 205B are arranged such that process variations are effectively averaged. For example, the thickness of a dielectric layer separating the top and bottom plates of the core capacitors 205 may be thinner at a first end and thicker at a second end of the array 200. By spatially distributing respective component capacitors 205A, 205B within the array 200, such a process variation results in the component capacitor 205A at the first end having a large capacitance value while the other corresponding component capacitor 205B at the second end has a smaller capacitance value. However, the core capacitor 205 formed by the parallel combination of the respective component capacitors 205A, 205B is the sum of the two capacitance values thereof. Thus, such variations are effectively averaged if each core capacitor 205 is formed by a plurality of component capacitors 205A, 205B spatially distributed across the array 200.

The guard capacitors 210 and/or the fringe capacitors 215 provide matching structure along the periphery of the core capacitors 205. Thus, the guard capacitors 210 and/or the fringe capacitors 215 provide for the uniform structure of each of the core capacitors 205. However, the guard capacitors 210 and the fringe capacitors 215 need not have the same width as the core capacitors 205 in order to provide substantially the same physical influence as adjacent core capacitors 205 provide each other. The uniformity of the adjacent physical structures, provided by the guard capacitors 210 and/or fringe capacitors 215, are adapted to reduce variations of the primary capacitance value of the individual core capacitors 205.

The arrangement of contacts 235, 245, 260 and interconnecting traces 280 also provide matching structures with respect to each core capacitor 205. Furthermore, the optional dummy contacts 270 and/or dummy traces provide matching structures along each side of the core capacitors 205. The optional guard capacitors G13–G16 at the corner of the array 200 also helps to provide matching structures at the corner of each of the core capacitors 205. The additional uniformity provided by such adjacent structures is adapted to further reduce variations of the primary capacitance value of the individual core capacitors 205.

Figure 3:
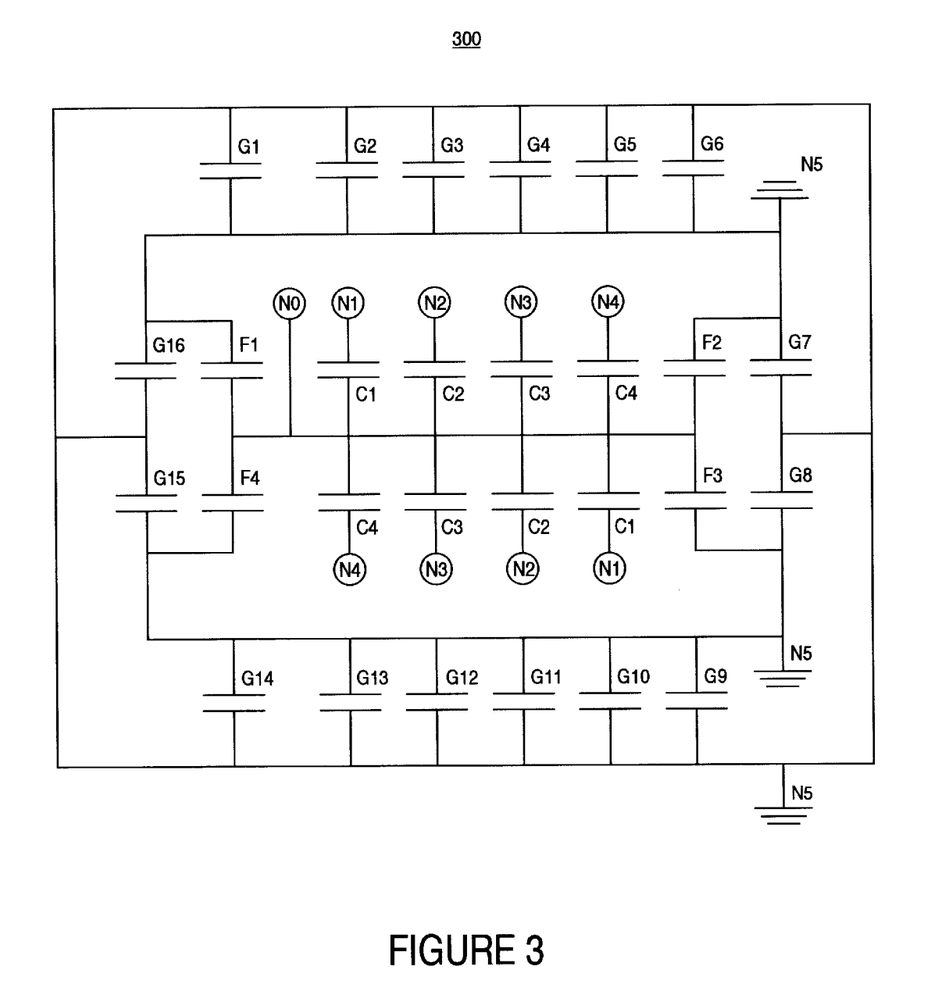
FIG. 3 shows an electrical schematic representation of a capacitor array, in accordance with one embodiment of the present invention.

Referring now to FIG. 3, an electrical schematic representation of a capacitor array 300, in accordance with one embodiment of the present embodiment, is shown. As depicted in FIG. 3, a first set of plates (e.g., top plates) of each of the core capacitors C1–C4 are coupled to a first node (NO) of a circuit. A first set of plates (e.g., top plates) of each of the fringe capacitors F1–F4 are also coupled to the first node (NO) of the circuit. Both set of plates (e.g., top and bottom plates) of the guard capacitors G1–G16 are coupled to a second node (N5), such as-ground. A second set of plates (e.g., bottom plates) of the fringe capacitors F1–F4 are also coupled to the second node (N5). A second set of plates (e.g., bottom plates) of each of the core capacitors C1–C4 are independent of each other, and are coupled to a respective independent node (N1, N2, N3, N4) of the circuit.

Referring back to FIG. 2 in view of FIG. 3, the guard capacitors 210 provide shielding for the core capacitors 205. Grounding both plates of the guard capacitors 210 blocks cross-coupling of signals between the core capacitors 205 and the surrounding circuitry.

The fringe capacitors 215 also provide substantially uniform parasitic capacitance components for each core capacitor 205. The fringe capacitors provide equivalent cross-coupling capacitances as adjacent core capacitors 205, because the top plate of each fringe capacitor 215 is electrically coupled in common with the top plates of the core capacitors 205. The total capacitance for each core capacitor 205 is represented by the equations in Table 2.

TABLE 2

$C1 = 2C_{1-1} + 2C_{1-2} + 2C_{1-4} + 2C_{1-F}$  $C3 = 2C_{3-3} + 2C_{3-2} + 2C_{3-4} + 2C_{3-2}$
$C2 = 2C_{2-2} + 2C_{2-1} + 2C_{2-3} + 2C_{2-3}$  $C4 = 2C_{4-4} + 2C_{4-3} + 2C_{4-1} + 2C_{4-F}$

Hence, each core capacitor has an equal number of contributing parasitic capacitance components.

Cross-coupling occurs between the edge of the bottom plate of one capacitor and the edge of the top plate of the adjacent capacitor. The adjacent oppositely disposed plates are only substantially parallel plates for the area along their respective edges. Therefore the amount of parasitic capacitance is substantially a function of the edge length and the distance between the parallel plates. Thus, the width of the fringe capacitors 215 may be substantially reduced, while still providing substantially the same parasitic component. As a result, only a small additional cost in the form of additional area occupied by the fringe capacitors 215 is incurred, while providing improved capacitance matching.

Figure 4:
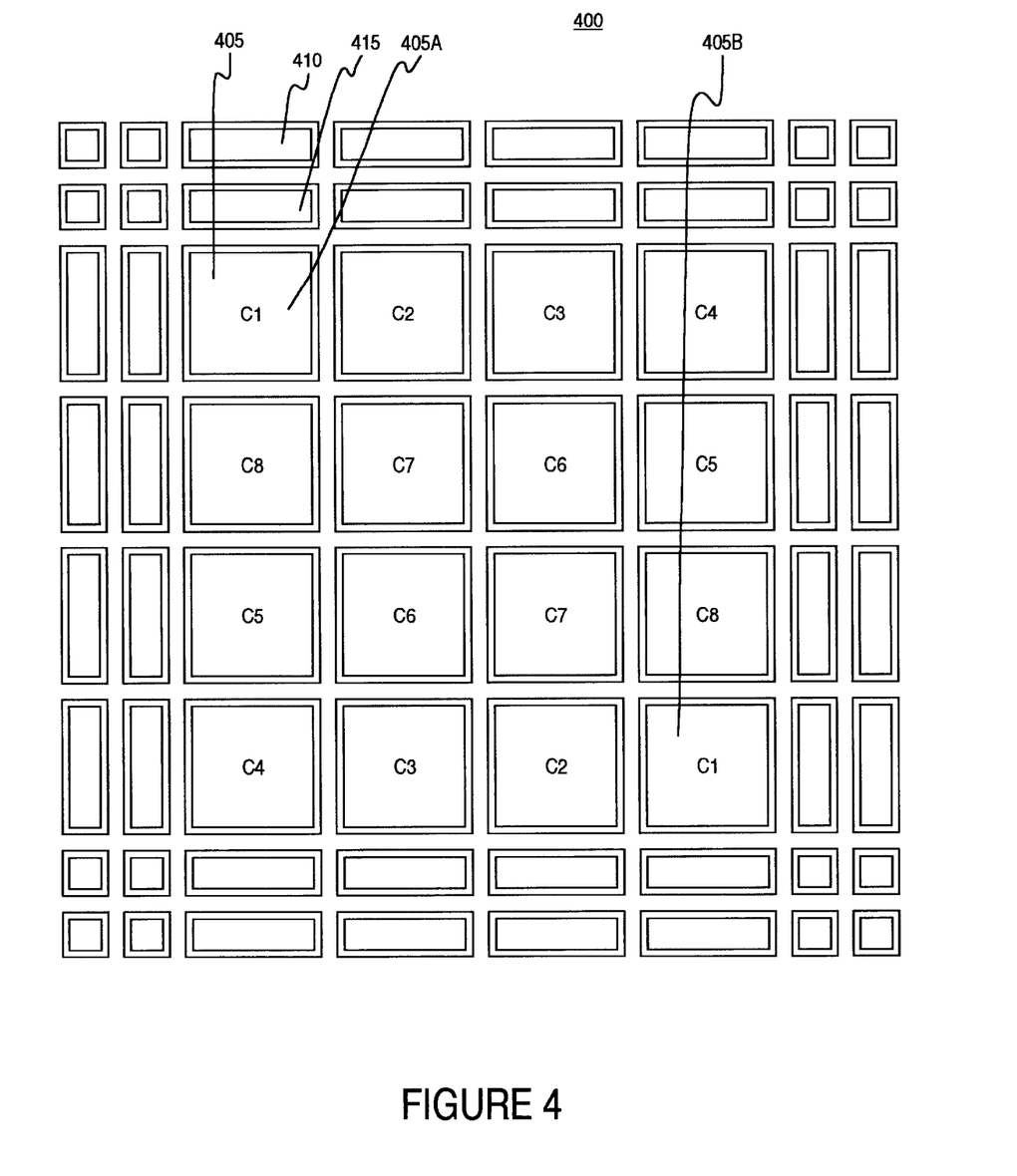
FIG. 4 shows a top view of a capacitor array, in accordance with one embodiment of the present invention.

Referring now to FIG. 4, a top view of a capacitor array 400, in accordance with one embodiment of the present invention, is shown. As depicted in FIG. 4, the capacitor array 400 comprises a plurality of core capacitors 405 arranged in rows and columns. A plurality of guard capacitors 410 are arranged at the beginning and the end of each row and column and at the corners of the core capacitors 405. A plurality of fringe capacitors 415 are arranged between the plurality of guard capacitors 410 and the beginning and the end of each row and column and the corners of the core capacitors 405.

Although not shown, the top plates of the core capacitors 405 are coupled to a first node of a circuit. The bottom plates of the core capacitors 405 are independent of each other and are coupled to a respective independent node of the circuit. The top and bottom plates of the guard capacitors 410 are coupled to a second node, such as ground. The top plates of the fringe capacitors 415 are coupled to the first node of the circuit. The bottom plates of the fringe capacitors 415 are coupled to the second node.

The guard capacitors 410 provide for core capacitors 405 having uniform structures. The guard capacitors 410 provide the same physical influence along the outside edge of each periphery core capacitor 405, as the structure on the interior side of the periphery core capacitors 405. However, the guard capacitors 410 need not have the same width as the core capacitors 405 in order to provide substantially the same physical influence as adjacent core capacitors 405 provide each other. Furthermore, the guard capacitors 410 also shield the core capacitors 405 from the surrounding circuitry. The corner guard capacitors 410 also provide additional physical matching and shielding, while requiring relatively small length and width dimensions.

The fringe capacitors 415 provide for core capacitors 405 having uniform structures. The fringe capacitors 415 provide the same physical influence along the outside of edge of each periphery core capacitor 405, as the structure on the interior side of the periphery core capacitors 405. However, the fringe capacitors 415 need not have the same width as the core capacitors 405 in order to provide substantially the same physical influence as adjacent core capacitors 405 provide each other. Thus, the primary capacitance of each core capacitor 405 is substantially equal as a result of the uniform adjacent structures.

Furthermore, the fringe capacitors 415 also provide equal parasitic capacitance components for each core capacitor 405. The amount of parasitic capacitance, with respect to interdigitating, is substantially a function of the edge length and the distance between the oppositely disposed adjacent plates, and not the width of the plates. Thus, the fringe capacitors 415 need not have the same width as the core capacitors 405 in order to provide substantially equivalent parasitic capacitance components.

The corner fringe capacitors 415 also provide additional physical matching. In addition, the corner fringe capacitors 415 increases uniformity of the parasitic components by adding components for interdigitating between diagonally displaced capacitors. The corner fringe capacitors 415 also require relatively small length and width dimensions, to substantially model the above-described physical and electrical influences.

In an optional implementation of the present invention, each core capacitor 405 may be fabricated as a plurality of physically separate capacitors 405A, 405B (hereinafter referred to as component capacitors). The individual component capacitors 405A, 405B are arranged such that process variations are effectively averaged. For example, the thickness of a dielectric layer separating the top and bottom plates of capacitors may be thinner at a first end and thicker at a second end of the array. By spatially distributing respective component capacitors 405A, 405B within the array 400, such a process variation results in the component capacitor 405A at the first end having a large capacitance value while the other corresponding component capacitor 405B at the second end has a smaller capacitance value. However, the core capacitor 405 formed by the parallel combination of the respective component capacitors 405A, 405B is the sum of the two capacitance values. Thus, such variations are effectively averaged if each core capacitor 405 is formed by a plurality of component capacitors 405A, 405B spatially distributed across the capacitor array 400.

Although not shown, the substantially uniform distributed placement of contacts, interconnecting traces, dummy contacts, and dummy interconnecting traces also provides for substantially equal physical and electrical influence upon the core capacitors. Thus, the primary and/or parasitic components for each core capacitors is more closely matched, by proper placement of contacts, interconnecting traces, dummy contacts, and dummy interconnecting traces.

Figure 5:
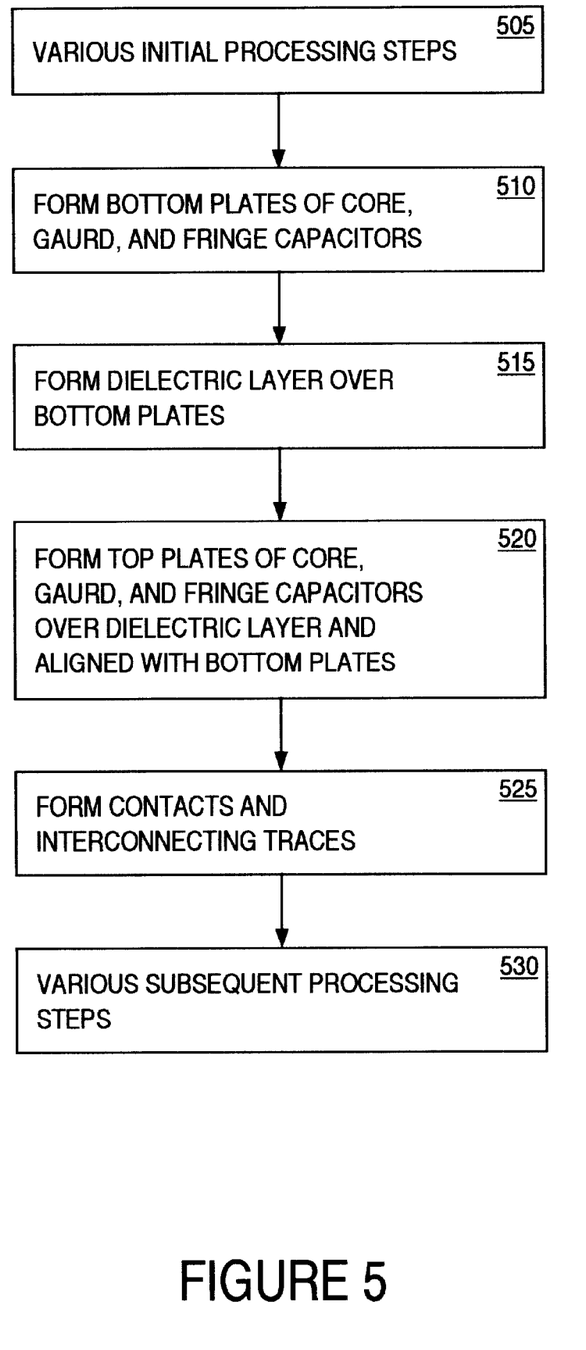
FIG. 5 shows a flow diagram of a method of fabricating a capacitor array, in accordance with one embodiment of the present invention.

Referring now to FIG. 5, a flow diagram of a method of fabricating a capacitor array, in accordance with one embodiment of the present invention, is shown. As depicted in FIG. 5, the process begins, at step 505, with various initial processing steps. The initial processing steps may comprise implanting, diffusion, deposition, masking, etching, cleaning, polishing, and the like.

Next at, step 510, a plurality of core capacitors bottom plates, a plurality of guard capacitors bottom plates, and a plurality of fringe capacitors bottom plates (hereinafter collectively referred to as the bottom plates) are formed. In one implementation, the bottom plates are formed by depositing a layer of polysilicon upon a wafer having a dielectric surface. The polysilicon layer can be formed by any well-known method such as chemical vapor deposition (CVD), or the like. The polysilicon layer can then be patterned to form the bottom plates by any well-known lithography and selective etching process.

In another implementation, the bottom plates are formed by depositing a layer of metal upon a wafer having a dielectric surface. The metal layer can be formed by any well-known method such as sputtering, or the like. The metal layer can then be patterned to form the bottom plates by any well-known lithography and selective etching process.

In another implementation, the bottom plates are formed by doping a semiconductor substrate. The doping can be provided by any well-known implanting process. The doped semiconductor substrate can then be patterned by forming isolation regions therein. The isolation regions can be formed by any well-known method such as local oxidation of silicon (LOCOS), shallow trench isolation (STI), or the like.

The bottom plates are arranged such that the core capacitor bottom plates comprise a plurality of rows and columns. The guard capacitor bottom plates are arranged adjacent each periphery core capacitor plate. The fringe capacitor bottom plates are arranged between each periphery core capacitor plate and each guard capacitor plate. If the core capacitor plates are arranged such that either the rows or columns thereof contain only two plates, then the fringe capacitors bottom plates are only located adjacent either the rows or the columns comprising more than two core capacitor bottom plates.

Next, at step 515, a dielectric layer is formed over the bottom plates. If the bottom plates are formed by a patterned polysilicon layer, metal layer, or the like, the dielectric layer is also formed between each of the individual bottom plates. The dielectric layer can be formed by any well-known method such as CVD of silicon dioxide, silicon nitride, or the like.

Next, at step 520, a plurality of core capacitors top plates, a plurality of guard capacitors top plates, and a plurality of fringe capacitors top plates (hereinafter collectively referred to as the top plates) are formed. Each top plate is substantially aligned to a corresponding bottom plate. In one implementation, the top plates are formed by depositing a layer of polysilicon upon the dielectric layer. The polysilicon layer can be formed by any well-known method such as chemical vapor deposition (CVD), or the like. The polysilicon layer can then be patterned to form the top plates by any well-known lithography and selective etching process.

In another implementation, the top plates are formed by depositing a layer of metal upon the dielectric layer. The metal layer can be formed by any well-known method such as sputtering, or the like. The metal layer can then be patterned to form the top plates by any well known lithography and selective etching process.

Next, at step 525, a plurality of contacts and interconnecting traces are formed. The contacts and interconnecting traces can be formed by any well-known processes such as lithography, selective etching, deposition, and/or the like.

A portion of the contacts and interconnecting traces couple the plurality of core capacitor top plates and the plurality of fringe capacitor top plates to a first node; and the plurality of guard capacitor top plates, the plurality of guard capacitor bottom plates and the plurality of fringe capacitor bottom plates to a second node. A second portion of the contacts and interconnecting traces independently couple the plurality of core capacitor bottom plates to associated independent nodes. Furthermore, the plurality of contacts and interconnecting traces are arranged so that each set of top and bottom plates are substantially physically and electrically influenced equally by the contacts and interconnecting traces.

Next at step 530, the process proceeds with other various subsequent process steps. The subsequent processing steps may comprise implanting, diffusion, deposition, masking, etching, cleaning, polishing, and the like.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A capacitor array comprising:
    a plurality of core capacitors arranged in a plurality of rows and a plurality of columns;
    a plurality of fringe capacitors coupled to said plurality of core capacitors; and
    a plurality of guard capacitors coupled to said plurality of fringe capacitors.

2. The capacitor array according to claim 1, wherein each of said core capacitors is comprised of a plurality of component capacitors spatially distributed in said capacitor array.

3. The capacitor array according to claim 1, further comprising a plurality of contacts substantially uniformly distributed between said plurality of core capacitors, said plurality of guard capacitors and said plurality of fringe capacitors.

4. The capacitor array according to claim 1, further comprising a plurality of interconnecting traces substantially uniformly distributed between said plurality of core capacitors, said plurality of guard capacitors and said plurality of fringe capacitors.

5. The capacitor array according to claim 1, wherein said plurality of guard capacitors provides electrical shielding for said plurality of core capacitors.

6. The capacitor array according to claim 1, wherein each core capacitor has a substantially equal primary capacitance.

7. The capacitor array according to claim 1, wherein each core capacitor has substantially equal parasitic capacitance components.

8. The capacitor array according to claim 1, wherein each core capacitor has substantially equivalent physical structures adjacent each edge.

9. The capacitor array according to claim 1, wherein the total capacitance of each core capacitor is substantially matched.

10. A capacitor array comprising:
   a plurality of core capacitors arranged in two rows and a plurality of columns;
   a plurality of guard capacitors arranged about the periphery of said plurality of core capacitors; and
   a plurality of fringe capacitors arranged between said plurality of guard capacitors and the beginning and end of said two rows of core capacitors.

11. The capacitor array according to claim 10, wherein each core capacitor has substantially matched interdigitating capacitance.

12. The capacitor array according to claim 10, wherein process variations, effecting the capacitance of each core capacitor, are substantial averaged by arranging each core capacitor as a plurality of component capacitors.

13. The capacitor array according to claim 10, wherein said guard capacitors, having substantially reduced widths, provide substantially equivalent structure adjacent said core capacitors.

14. The capacitor array according to claim 10, wherein said fringe capacitors, having substantially reduced widths, provide substantially equivalent structure adjacent said core capacitors.

15. The capacitor array according to claim 10, wherein said plurality of guard capacitors provide shielding for said plurality of core capacitors.

* * * * *